(12) United States Patent　　(10) Patent No.: US 11,640,966 B2
Liu et al.　　(45) Date of Patent: May 2, 2023

(54) PHOTOSENSITIVE ASSEMBLY, METHOD FOR MANUFACTURING SAME, AND ELECTRONIC DEVICE COMPRISING A VIBRATION MEMBER TO VIBRATE AN ORTHOGRAPHIC PROJECTION REGION OF A LIGHT SENSOR ON A LIGHT TRANSMISSIVE SUBSTRATE IN AN UNDULATED SHAPE

(71) Applicant: BOE Technology Group Co., Ltd., Beijing (CN)

(72) Inventors: Xiaotong Liu, Beijing (CN); Yuju Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/665,802

(22) Filed: Feb. 7, 2022

(65) Prior Publication Data

US 2022/0285417 A1　Sep. 8, 2022

(30) Foreign Application Priority Data

Mar. 3, 2021　(CN) .......................... 202110235406.8

(51) Int. Cl.
*H01L 27/146*　(2006.01)
*G06V 40/13*　(2022.01)

(52) U.S. Cl.
CPC .... *H01L 27/14625* (2013.01); *G06V 40/1312* (2022.01)

(58) Field of Classification Search
CPC .......... H01L 27/14625; G06V 40/1312; G06V 40/1324; G01J 1/42; G01J 1/0403
USPC ....................................................... 250/216
See application file for complete search history.

(56) References Cited

U.S. PATENT DOCUMENTS 10,846,501 B2 * 11/2020 Rasmussen ........ G06V 40/1306

FOREIGN PATENT DOCUMENTS

CN　　　　1933149 A　　3/2007

* cited by examiner

*Primary Examiner* — Que Tan Le
*Assistant Examiner* — Mai Thi Ngoc Tran
(74) *Attorney, Agent, or Firm* — IPro, PLLC

(57) ABSTRACT

Disclosed are a photosensitive assembly, a method for manufacturing the same, and an electronic device. The photosensitive assembly includes a light-transmissive substrate, a light sensor, and a vibration member. The light sensor is disposed on a side of the light-transmissive substrate, and the vibration member is configured to drive the light-transmissive substrate to vibrate, such that a photosensitive area of the light-transmissive substrate is in an undulated shape.

20 Claims, 9 Drawing Sheets

PHOTOSENSITIVE ASSEMBLY, METHOD FOR MANUFACTURING SAME, AND ELECTRONIC DEVICE COMPRISING A VIBRATION MEMBER TO VIBRATE AN ORTHOGRAPHIC PROJECTION REGION OF A LIGHT SENSOR ON A LIGHT TRANSMISSIVE SUBSTRATE IN AN UNDULATED SHAPE

CROSS-REFERENCE TO RELATED APPLICATION

This application is based on and claims the priority to Chinese Patent Application No. 202110235406.8, filed on Mar. 3, 2021 and entitled "PHOTOSENSITIVE ASSEMBLY AND ELECTRONIC DEVICE," the disclosure of which is incorporated herein by reference in its entirety.

TECHNICAL FIELD

The present disclosure relates to a photosensitive assembly, a method for manufacturing the same, and an electronic device.

BACKGROUND

An infrared detection device typically includes a photosensitive element and a microlens. The microlens is configured to converge infrared light radiated to the infrared detection device to a central area of the photosensitive element, so as to improve detection efficiency of the infrared detection device.

SUMMARY

Embodiments of the present disclosure provide a photosensitive assembly, a method for manufacturing the same, and an electronic device.

According to a first aspect of the embodiments of the present disclosure, a photosensitive assembly is provided. The photosensitive assembly includes:

a light-transmissive substrate;

a light sensor, disposed on a side of the light-transmissive substrate; and a vibration member, configured to drive the light-transmissive substrate to vibrate, such that a photosensitive area of the light-transmissive substrate is in an undulated shape, wherein the photosensitive area includes an orthographic projection region of the light sensor on the light-transmissive substrate.

In some embodiments, the light-transmissive substrate is a glass substrate.

In some embodiments, a thickness of the light-transmissive substrate ranges from 0.01 mm to 10 mm.

In some embodiments, the photosensitive assembly includes m vibration members, wherein the m vibration members are arranged into k vibration member groups on the light-transmissive substrate, the vibration member group extends along a first direction and includes at least one vibration member, and both m and k are positive integers.

In some embodiments, a vibration member of at least one of the vibration member groups extends along the first direction to an edge of the light-transmissive substrate.

In some embodiments, for two ends of any one vibration member of at least one of the vibration member groups in the first direction, a gap is defined between at least one of the two ends and an edge of the light-transmissive substrate.

In some embodiments, at least one of the vibration member groups includes a plurality of vibration members, and the plurality of vibration members are arranged along the first direction.

In some embodiments, the light-transmissive substrate is provided with a first edge extending along the first direction; wherein a distance between the first edge and an orthographic projection of the vibration member most proximal to the first edge among the m vibration members on the light-transmissive substrate is not less than half of a reference dimension, wherein the reference dimension is half of a wavelength of a vibration wave transmitted by the light-transmissive substrate in response to vibration at a first-order natural frequency.

In some embodiments, k is greater than 1, and the k vibration member groups are arranged in a second direction, wherein the second direction is parallel to a plane where the light-transmissive substrate is disposed and perpendicular to the first direction; and a distance between first axes of any two adjacent vibration member groups among the k vibration member groups ranges from $(n+0.8)*Dref$ to $(n+1.2)*Dref$, wherein the first axis is parallel to the first direction, n represents a natural number, and Dref represents the reference dimension.

In some embodiments, the light-transmissive substrate is provided with a first edge extending along the first direction; wherein a distance between a first axis of any one of the vibration member groups and the first edge ranges from $(n+0.3)*Dref$ to $(n+0.7)*Dref$, wherein the first axis is parallel to the first direction, n represents a natural number, and Dref represents a reference dimension, wherein the reference dimension is half of a wavelength of a vibration wave transmitted by the light-transmissive substrate in response to vibration at a first-order natural frequency.

In some embodiments, a dimension of the vibration member in a second direction ranges from 1 mm to 10 mm, wherein the second direction is parallel to a plane where the light-transmissive substrate is disposed and perpendicular to the first direction.

In some embodiments, a dimension of the vibration member in the second direction is not greater than a reference dimension, wherein the reference dimension is half of a wavelength of a vibration wave transmitted by the light-transmissive substrate in response to vibration at a first-order natural frequency, and the second direction is parallel to a plane where the light-transmissive substrate is disposed and perpendicular to the first direction.

In some embodiments, an orthographic projection of the vibration member on the light-transmissive substrate is not overlapped with an orthographic projection of the light sensor on the light-transmissive substrate.

In some embodiments, an orthographic projection of the vibration member on the light-transmissive substrate is at least partially overlapped with an orthographic projection of the light sensor on the light-transmissive substrate, and a light transmittance of the vibration member is not less than 10%.

In some embodiments, a thickness of the vibration member ranges from 0.1 um to 10 um.

In some embodiments, the photosensitive assembly further includes a collimator, disposed between the light sensor and the light-transmissive substrate.

In some embodiments, an area in the collimator corresponding to the light sensor is light-transmissive. For example, the collimator includes a light-shielding substrate, wherein the light-shielding substrate includes a light-transmissive aperture corresponding to the light sensor, and an orthographic projection of the light sensor on the light-shielding substrate is at least partially overlapped with the light-transmissive aperture.

In some embodiments, the collimator is connected to the light-transmissive substrate via an optical adhesive layer.

In some embodiments, a refractive index of the optical adhesive layer is equal to a refractive index of the light-transmissive substrate.

In some embodiments, the light sensor and the vibration member are disposed on a same side of the light-transmissive substrate.

According to a second aspect of the embodiments of the present disclosure, a method for manufacturing a photosensitive assembly is provided. The method includes:

providing a light-transmissive substrate; and forming a light sensor and a vibration member on the light-transmissive substrate;

wherein the vibration member is configured to drive the light-transmissive substrate to vibrate, such that a photosensitive area of the tight-transmissive substrate is in an undulated shape, and wherein the photosensitive area includes an orthographic projection region of the light sensor on the light-transmissive substrate.

In some embodiments, the method further includes: forming a collimator on the light-transmissive substrate.

In some embodiments, forming the light sensor on the light-transmissive substrate includes forming the light sensor on a side of the collimator distal from the light-transmissive substrate, wherein an area in the collimator corresponding to the light sensor is light-transmissive.

According to a third aspect of the embodiments of the present disclosure, an electronic device is provided. The electronic device includes a photosensitive assembly according to the first aspect or any optional manner of the first aspect

DETAILED DESCRIPTION

Figure 1:
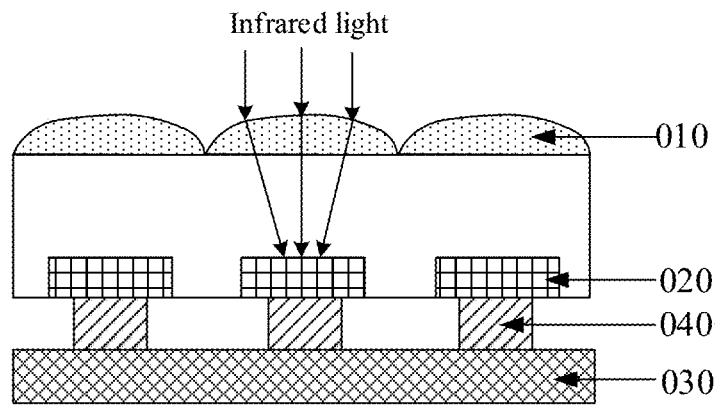
FIG. 1 is a schematic structural diagram of an infrared detection device according to the related art.

Embodiments of the present disclosure are described hereinafter with reference to the accompanying drawings, and the following embodiments may be practiced in a variety of manners and should not be construed as limitation to the embodiments se forth herein. These embodiments are provided to make the present disclosure comprehensive and complete, and exemplarily convey the ideas of the present disclosure to those skilled in the art. Identical reference numerals in the accompanying drawings indicate identical or similar structures, and thus their detailed descriptions will be omitted. In addition, the accompanying drawings are only schematic illustrations of the present disclosure and are not necessarily drawn to scale.

Although relative terms such as "up" and "down" are adopted in the present disclosure to describe the relative relationship of one component in the accompanying drawings to another, these terms are adopted in this specification only for convenience. In the case that the device in the accompanying drawings is flipped to make it upside down, the component described as being "up" may become the component described as being "down." When a structure is "on" other structures, it may mean that the structure is integrally formed on other structures, or that the structure is "directly" provided on other structures, or that the structure is "indirectly" provided on other structures via another structure.

In the present disclosure, the terms "one," "a," "the,", "said," "at least one," or the like are adopted to indicate the presence of one or more elements/components/or the like. The terms "include" and "have" are adopted to indicate an open-ended and non-exclusive meaning and to mean that additional elements, components or the like may exist besides the listed elements, components or the like. In addition, the terms "first," "second," "third," and the like in the claims are adopted only as marks rather than the numerical limitation on the objects. The term "and/or" merely describes the association relationship between the associated objects and indicates three relationships; for example, A and/or B may indicate three cases where only A exists, A and B exist at the same time, and only B exists. The symbol "/" generally indicates that the relationship between the former and later associated objects is selective.

An infrared detection device is a device that converts an infrared signal (i.e., infrared light) into an electrical signal. The infrared detection device may be applicable to object detection, fingerprint recognition, image display, and the like.

FIG. 1 is a schematic structural diagram of an infrared detection device according to the related art. The infrared detection device includes a photosensitive element layer, a microlens layer on a side of the photosensitive element layer, and a photosensitive driving circuit 030 on the other side of the photosensitive element layer. The photosensitive element layer includes a plurality of photosensitive elements 020, and the photosensitive elements 020 may be infrared sensors. The microlens layer includes a plurality of microlenses 010, and the plurality of microlenses 010 correspond to the plurality of photosensitive elements 020. The microlens 010 is configured to converge the infrared light radiated to the microlens 010 to a central area of the corresponding photosensitive element 020. The photosensitive driving circuit 030 is connected to the photosensitive element 020 via a conductive structure 040. The photosensitive driving circuit 030 is configured to drive the photosensitive element 020 to detect the infrared light, such that the object detection is realized. The radius of curvature of the microlens 010 herein is constant, such that the infrared detection device as shown in FIG. 1 may only detect the objects within a specific range.

For example, the infrared detection device shown in FIG. 1 may be an infrared fingerprint recognizing chip. Since the curvature radius of of the microlens 010 is constant, only in the case that the finger presses on the surface of the infrared fingerprint recognizing chip (i.e., the surface of the infrared detection device, such as the surface of the microlens layer distal from the photosensitive element layer), the microlens 010 can converge the infrared light radiated from the finger to the photosensitive element 020, such that the fingerprint on the finger can be detected by the fingerprint recognizing chip. In the case that the finger is not pressed on the surface of the infrared fingerprint recognizing chip, for example, the finger is in a suspended state, the infrared light radiated from the finger may fail to be converged to the photosensitive element 020 by the microlens 010. In this case, the infrared fingerprint recognizing chip fails to detect the fingerprint on the finger. In other words, the infrared fingerprint recognizing chip can only achieve contact fingerprint recognition, and cannot achieve non-contact fingerprint recognition.

Embodiments of the present disclosure provide a photosensitive assembly and a method for manufacturing photosensitive assembly, and an electronic device. The photosensitive assembly includes a light-transmissive substrate, a light sensor, and a vibration member. The light sensor is disposed on a side of the light-transmissive substrate for detecting light. The vibration member is configured to drive the light-transmissive substrate to vibrate, such that a photosensitive area of the light-transmissive substrate is in an undulated shape. The photosensitive area includes an orthographic projection region of the light sensor on the light-transmissive substrate. The photosensitive area in a undulated shape of the light-transmissive substrate converges the light radiated to the photosensitive area to the light sensor, such that the light sensor can perform a light detection. Furthermore, zoom function can be realized by controlling undulation degree of the photosensitive area of the light-transmissive substrate to change. In this way, the photosensitive assembly can detect a target object in different ranges.

Embodiments of the photosensitive assembly according to the present disclosure will be described below with reference to the accompanying drawings.

Figure 2:
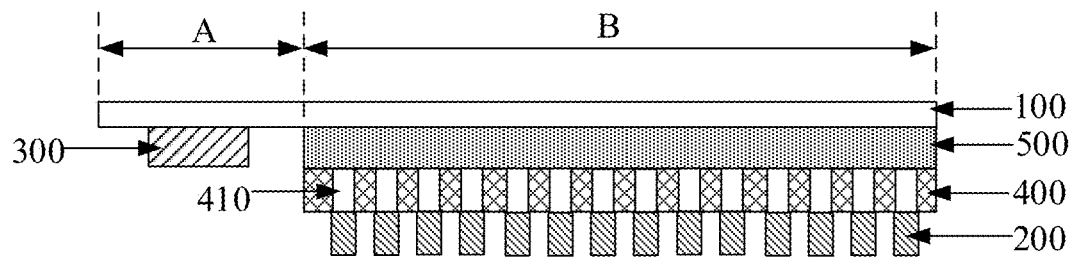
FIG. 2 is a schematic structural diagram of a photosensitive assembly according to an embodiment of the present disclosure.

FIG. 2 is a schematic structural diagram of a photosensitive assembly according to an embodiment of the present disclosure. The photosensitive assembly includes a light-transmissive substrate 100, a light sensor 200, and a vibration member 300. The light sensor 200 is disposed on a side of the light-transmissive substrate 100 for detecting light. The vibration member 300 is disposed on a side of the light-transmissive substrate 100, and is configured to drive the light-transmissive substrate 100 to vibrate, such that the photosensitive area of the light-transmissive substrate 100 is in an undulated shape.

The photosensitive area includes an orthographic projection region of the light sensor 200 on the light-transmissive substrate 100. In an exemplary embodiment, the photosensitive assembly includes a plurality of light sensors 200 that form a photosensitive array. The photosensitive area may be an orthographic projection region of the photosensitive array on the light-transmissive substrate 100. An orthographic projection region of the photosensitive array on the light-transmissive substrate 100 includes the orthographic projection region of the light sensor 200 in the photosensitive array on the light-transmissive substrate 100, and an orthographic projection region of a gap between adjacent light sensors 200 on the light-transmissive substrate 100, which is not limited in the embodiments of the present disclosure.

In embodiments of the present disclosure, the vibration member 300 is disposed on the light-transmissive substrate 100. The vibration member 300 may be applied with an alternating voltage, such that the vibration member 300 is driven to vibrate via the alternating voltage. The vibration wave generated during the vibration of the vibration member 300 may be transmitted to the light-transmissive substrate 100, such that the light-transmissive substrate 100 vibrates together with the vibration member 300. That is, the light-transmissive substrate 100 is driven to vibrate by the vibration member 300. During the vibration of the light-transmissive substrate 100, the photosensitive area of the light-transmissive substrate 100 is in an undulated shape, such that the effect of light convergence is achieved.

Figure 3:
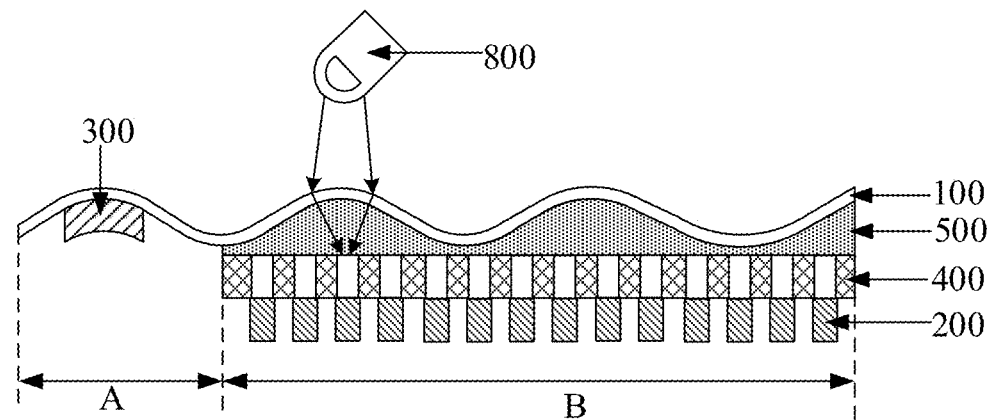
FIG. 3 is a schematic diagram of a light-transmissive substrate being driven to vibrate by a vibration member according to an embodiment of the present disclosure.
Figure 4:
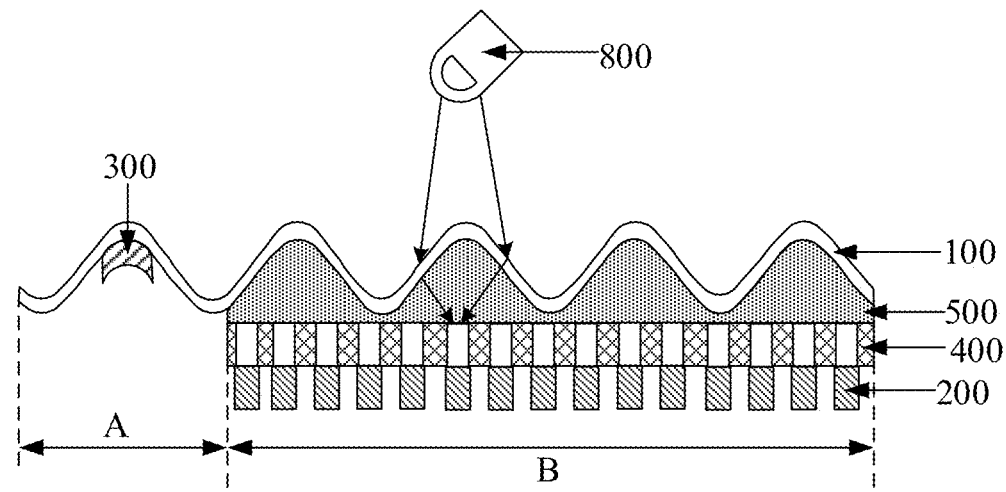
FIG. 4 is a schematic diagram of a light-transmissive substrate being driven to vibrate by another vibration member according to an embodiment of the present disclosure.
Figure 5:
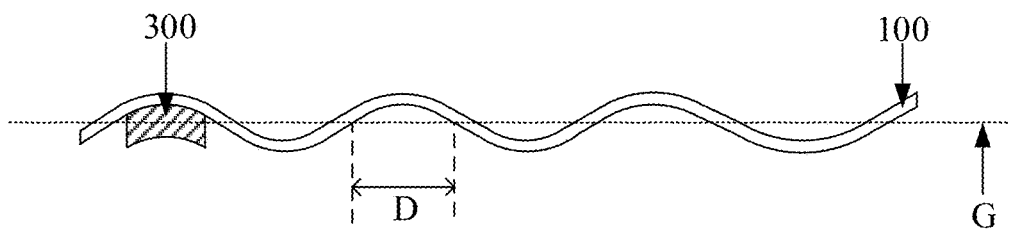
FIG. 5 is a schematic diagram of a light-transmissive substrate being driven to vibrate by still another vibration member according to an embodiment of the present disclosure.

In an exemplary embodiment, FIGS. 3 to 5 are schematic diagrams in which the light-transmissive substrate 100 is driven to vibrate by the vibration member 300. FIG. 5 merely shows the light-transmissive substrate 100 and the vibration member 300. As shown in FIGS. 3 to 5, in the case that the alternating voltage is applied to the vibration member 300, such that the vibration member 300 vibrates. A vibration direction of the vibration member 300 may be perpendicular to the plane where the light-transmissive substrate 100 is disposed (referring to the plane where the light-transmissive substrate 100 that is not in vibration is disposed). The light-transmissive substrate 100 vibrates under the drive of the vibration member 300. The vibration wave may be transmitted during the vibration of the light-transmissive substrate 100, such that the light-transmissive substrate 100 is deformed and in an undulated shape. As shown in FIG. 5, the light-transmissive substrate 100 includes a vibration reference surface G, and the vibration reference surface G is substantially identical to the plane where the light-transmissive substrate 100 that is not in vibration is disposed. At a certain instant of vibration of the light-transmissive substrate 100, a partial area of the light-transmissive substrate 100 is disposed below the vibration reference surface G in a recessed shape, and the remaining area is disposed above the vibration reference surface G in a protrusive shape. The portion of the light-transmissive substrate 100 in the protrusive shape is equivalent to a microlens, and has an effect of light convergence. That is, the light-transmissive substrate 100 exhibits a microlens-like structure during vibration, and the microlens-like structure may achieve light convergence. As a result, the photosensitive assembly may implement a function of converging the light to the light sensor 200. The vibration state of the vibration member 300 may change in the case that the frequency and/or amplitude of the alternating voltage driving the vibration member 300 are/is changed, such that the vibration state is changed, and thereby the undulation degree of the light-transmissive substrate 100 (e.g., the vibration amplitude and/or vibration frequency of the light-transmissive substrate 100) are/is changed. In this way, the light-transmissive substrate 100 can be provided with a zoom function. In the case that a distance between target object 800 and the photosensitive assembly changes, light from the target object 800 may still be converged to the light sensor 200 by adjusting the frequency and/or magnitude of the alternating voltage driving the vibration member 300. The frequencies and/or magnitudes of alternating voltage driving the vibration member 300 in FIGS. 3 and 4 are different, such that undulation degrees of the light-transmissive substrate 100 are different. Therefore, the photosensitive assembly in FIGS. 3 and 4 are able to detect target objects in different ranges. In embodiments of the present disclosure, light convergence effect of light-transmissive substrate 100 may be adjusted by adjusting the frequency and/or magnitude of the alternating voltage driving the vibration member 300 in real time, such that a function similar to real-time zooming can be achieved. The photosensitive assembly is capable of detecting target objects in different ranges, and can achieve not only contact detection but also non-contact detection.

In summary, according to the photosensitive assembly provided by the embodiments of the present disclosure, the light-transmissive substrate may be driven to vibrate by the vibration member, such that the photosensitive area of the light-transmissive substrate is in an undulated shape. The photosensitive area of the light-transmissive substrate in the undulated shape can converge the light radiated to the photosensitive area to the light sensor, such that the light sensor can perform a light detection. Furthermore, zoom function can be realized by controlling undulation degree of the photosensitive area of the light-transmissive substrate to change. In this way, the photosensitive assembly can detect a target object in different ranges. In addition, the photosensitive assembly uses the light-transmissive substrate for focusing without a need for a microlens. In this way, the thickness and volume of the photosensitive assembly can be reduced, which facilitates the slimness of the electronic device based on the photosensitive assembly.

In embodiments of the present disclosure, the vibration member 300 may be boned to the light-transmissive substrate 100. Alternatively, the vibration member 300 may be directly manufactured on the light-transmissive substrate 100. As a result, the vibration member 300 is mechanically connected to the light-transmissive substrate 100, and capable of transmitting vibration to the light-transmissive substrate 100. The vibration member 300 and the light sensor 200 herein may be disposed on a same side of the light-transmissive substrate 100 or on different sides of the light-transmissive substrate 100. For example, as shown in FIG. 2, the vibration member 300 and the light sensor 200 may be disposed on a same side of the light-transmissive substrate 100, such that the thickness and volume of the photosensitive assembly can be reduced, facilitating the slimness of the photosensitive assembly.

Figure 6:
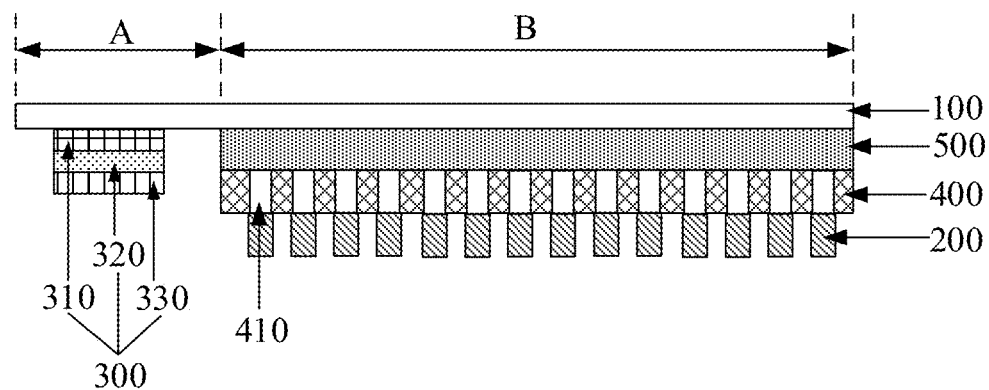
FIG. 6 is a schematic structural diagram of another photosensitive assembly according to an embodiment of the present disclosure.

In an optional embodiment, the vibration member 300 includes a driving electrode. The vibration member 300 can be driven, by the alternating voltage applied by the driving electrode, to vibrate. In an exemplary embodiment, FIG. 6 is a schematic structural diagram of another photosensitive assembly according to an embodiment of the present disclosure. The vibration member 300 includes a first electrode 310, a piezoelectric layer 320, and a second electrode 330, which are laminated in sequence. The first electrode 310 and the second electrode 330 are both driving electrodes of the vibration member 300. The piezoelectric layer 320 may be drive to produce periodic deformation by the alternating voltage which is applied to the vibration member 300 via the first electrode 310 and the second electrode 330, such that the vibration member 300 can vibrate. FIG. 6 is illustrated by taking an example in which the first electrode 310, the piezoelectric layer 320, and the second electrode 330 are sequentially laminated along a direction distal from the light-transmissive substrate 100, or the second electrode 330, the piezoelectric layer 320, and the first electrode 310 are sequentially laminated along the direction distal from the light-transmissive substrate 100. Alternatively, the vibration member 300 may be of other structures, which is not limited in embodiments of the present disclosure.

The material of the piezoelectric layer 320 may be an inorganic piezoelectric material, an organic piezoelectric material, or a composite piezoelectric material. For example, the material of the piezoelectric layer 320 includes at least one of plumbum zirconate titanate piezoelectric ceramic (PZT), polyvinylidene fluoride (PVDF), zinc oxide (ZnO), and the like. The materials of the first electrode 310 and the second electrode 330 are both conductive materials, which may be metal materials, conductive metal oxides, conductive polymeric materials, conductive composite materials, or combinations thereof. For example, the metal material may be platinum, gold, silver, aluminum, chromium, nickel, copper, molybdenum, titanium, magnesium, calcium, barium, sodium, palladium, iron, manganese, or combinations thereof. The conductive metal oxide may be an indium oxide, a tin oxide, an indium tin oxide, a fluorine doped tin oxide, an aluminum doped zinc oxide, a gallium doped zinc oxide, or combinations thereof. The conductive polymeric material may be polyaniline, polypyrrole, polythiophene, polyacetylene, poly(3,4-extended ethylenedioxythiophene)/polystyrene sulfonic acid (PEDOT/PSS) or combinations thereof. The conductive polymeric material may be added with a dopant such as an acid (e.g., hydrochloric acid, sulfuric acid, sulfonic acid), a lewis acid (e.g., phosphorus fluoride, arsenic fluoride, ferric chloride), a halogen, an alkali metal, or the like. The conductive composite material may be a conductive composite material dispersed with carbon black, graphite powder, metal microparticles, or the like. The materials of the first electrode 310 and the second electrode 330 may be the same or different, and the materials of the first electrode 310 and the second electrode 330 may include at least one of molybdenum (Mo), platinum (Pt), and indium tin oxide (ITO).

In embodiments of the present disclosure, the material of the light-transmissive substrate 100 may be a transparent organic material, a transparent inorganic material, or a mixture of the transparent organic material and the transparent inorganic material. Alternatively, the light-transmissive substrate 100 is composed of an organic material layer and an inorganic material layer that are laminated to allow the the the light-transmissive substrate 100 to be light-transmissive. The light-transmissive substrate 100 may be a rigid substrate rather than a bendable substrate, such that the light-transmissive substrate 100 may well transmit the vibration applied by the vibration member 300, reducing the energy loss during the process of transmitting the vibration. For example, the light-transmissive substrate 100 may be a glass substrate. The light-transmissive substrate 100 may for example be a glass substrate with a multi-orders natural frequency. In this way, the vibration frequency of the vibration member 300 may be equal or close to the natural frequency of the light-transmissive substrate 100 at a certain order by adjusting the frequency of the alternating voltage driving the vibration member 300, such that the light-transmissive substrate 100 occurs resonance, and thereby generate a stable and significant vibration. The vibration frequency of the vibration member 300 may be equal or close to the natural frequency of the light-transmissive substrate 100 at another order by adjusting the frequency of the alternating voltage driving the vibration member 300, such that the light-transmissive substrate 100 vibrates at a natural frequency of another order.

The light-transmissive substrate 100 herein may have a thickness of 0.01 mm to 10 mm. That is, the thickness of the light-transmissive substrate 100 may range from 0.01 mm to 10 mm, such that the light-transmissive substrate 100 may be guaranteed to have sufficient mechanical properties to transmit the vibration wave. The thickness of the light-transmissive substrate 100 refers to a dimension of the light-transmissive substrate 100 in a direction perpendicular to the plate surface of the light-transmissive substrate 100. Light-transmissive sheets with a thickness ranged from 0.01 mm to 10 mm are provided, and the light-transmissive substrate 100 may be selected from existent light-transmissive sheets with a thickness ranged from 0.01 mm to 10 mm, such that manufacturing costs of the photosensitive assembly can be reduced. In an exemplary embodiment, the thickness of the light-transmissive substrate 100 ranges from 0.1 mm to 1 mm, for example 0.3 mm to 0.5 mm.

Figure 7:
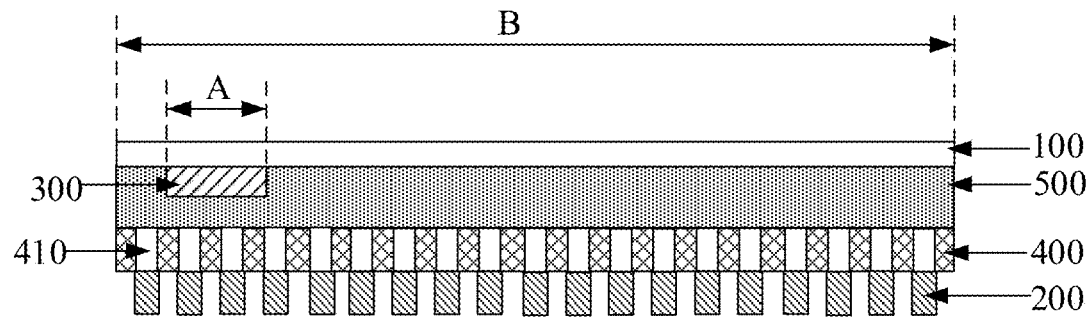
FIG. 7 is a schematic structural diagram of still another photosensitive assembly according to an embodiment of the present disclosure.

In an optional embodiment, the photosensitive assembly includes a plurality of light sensors 200 which may form a photosensitive array. The light-transmissive substrate 100 includes a first area A configured to be disposed with the vibration member 300 and a second area B configured to be disposed with the photosensitive array. The second area B may be a photosensitive area of the light-transmissive substrate 100. As shown in FIGS. 2 and 6, the first area A is disposed on a side of the second area B. Alternatively, as shown in FIG. 7, the first area A is disposed within the second area B. Alternatively, except as shown in FIG. 2, FIG. 6, and FIG. 7, the first area A may be partially overlapped with the second area B. In other words, the orthographic projection of the vibration member 300 on the light-transmissive substrate 100 may be not overlapped with the orthographic projection of the photosensitive array on the light-transmissive substrate 100 or the orthographic projection of the vibration member 300 on the light-transmissive substrate 100 may be disposed within the orthographic projection of the photosensitive array on the light-transmissive substrate 100; or the orthographic projection of the vibration member 300 on the light-transmissive substrate 100 may be partially overlapped with the orthographic projection of the photosensitive array on the light-transmissive substrate 100.

The structure of the light-transmissive substrate 100 may be configured as desired. For example, the shape of the plate surface of the light-transmissive substrate 100 may be square, rectangular, circular, oval, hexagonal, octagonal, or in other shapes. The shape of the plate surface of the light-transmissive substrate 100 may for example be rectangular. FIGS. 8 to 12 are bottom views of the photosensitive assembly according to embodiments of the present disclosure. For example, any one of FIGS. 8 to 12 may be a bottom view of FIG. 2 or FIG. 6. As shown in FIGS. 8 to 12, the first area A is disposed on a side of the second area B, such that integrity of each of the first area A and the second area B may be improved, facilitating the centralized arrangement of the light sensor 200, and the relatively independent arrangement of the light sensor 200 and the vibration member 300. In an exemplary embodiment, the light-transmissive substrate 100 includes a first edge 101 extending along a first direction C. The first area A is approximate to the first edge 101, runs through the light-transmissive substrate 100 along the first direction C, and is disposed on a side of the second area B.

Figure 11:
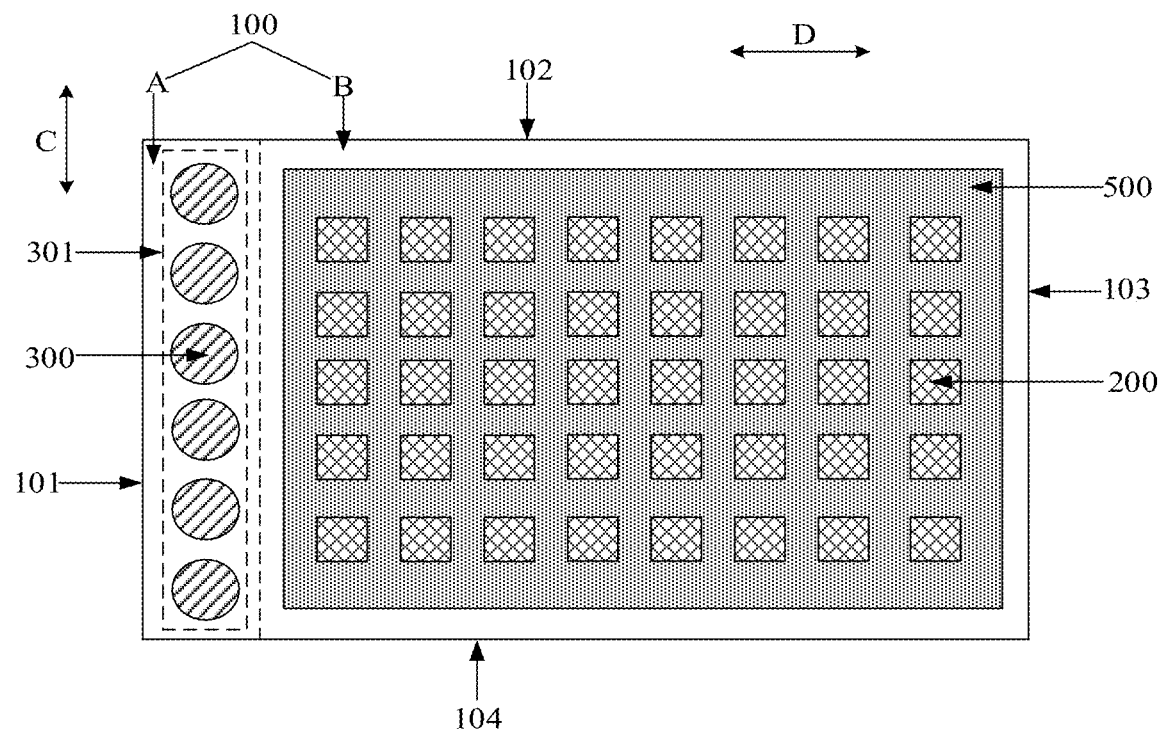
FIG. 11 is a bottom view of yet another photosensitive assembly according to an embodiment of the present disclosure.
Figure 12:
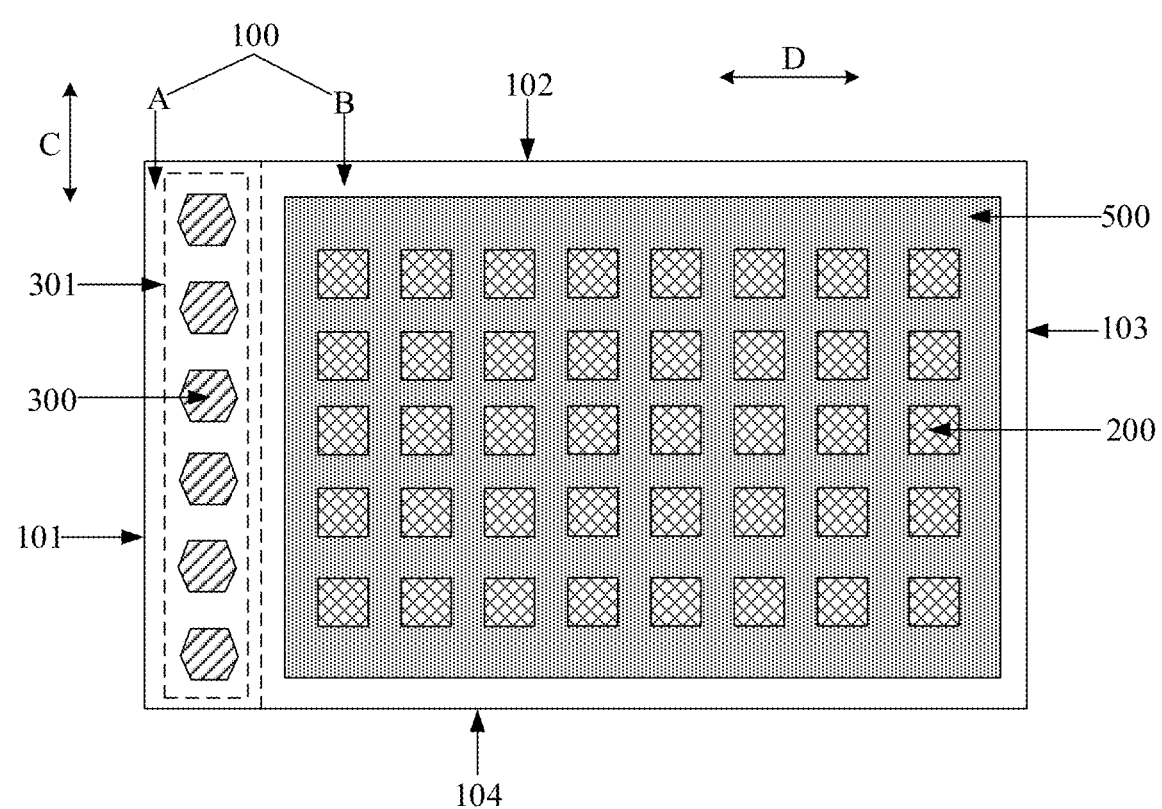
FIG. 12 is a bottom view of yet another photosensitive assembly according to an embodiment of the present disclosure.
Figure 13:
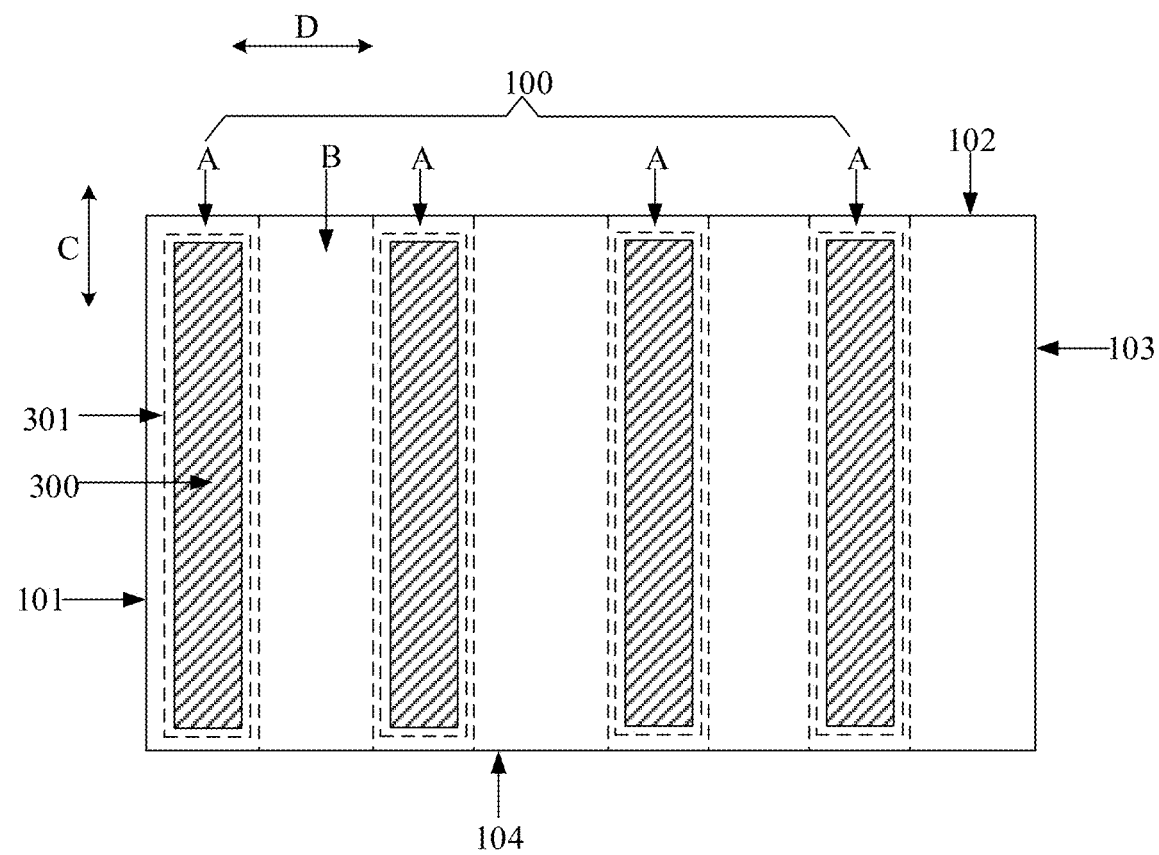
FIG. 13 is a bottom view of yet another photosensitive assembly according to an embodiment of the present disclosure.

FIGS. 8 to 12 are illustrated by taking an example in which the first area A is disposed on a side of the second area B. The first area A may also be disposed within the second area B, or may be partially overlapped with the second area B. In the case that the first area A is disposed within the second area B or is partially overlapped with the second area B, the first area A may also extend along the first direction C, and may also run through the light-transmissive substrate 100 along the first direction C. For example, the first area A is approximate to the first edge 101 of the light-transmissive substrate 100 and extends along the first direction C. FIG. 2 and FIGS. 6 to 11 are illustrated by taking an example in which the light-transmissive substrate 100 includes one first area A, and the light-transmissive substrate 100 may include a plurality of first areas. For example, as shown in FIG. 13, the light-transmissive substrate 100 includes a plurality of first areas A. The plurality of first areas A are all disposed within the second area B, and all extend along the first direction C, such that the orthographic projection of the vibration member 300 on the light-transmissive substrate 100 may be disposed within the orthographic projection of the photosensitive array (the light sensor 200 is not shown in FIG. 13 for brevity) on the light-transmissive substrate 100. In the case that the first area A is overlapped with the second area B (including cases where the first area A overlapped partially overlapped with or is disposed within the second area B), the orthographic projection of the vibration member 300 on the light-transmissive substrate 100 is overlapped with the orthographic projection of the light sensor 200 on the light-transmissive substrate 100. The vibration member 300 needs to have a good light transmittance, so that light can pass through the vibration member 300. For example, the vibration member 300 may have a light transmittance of not less than 10% in the direction perpendicular to the plate surface of the light-transmissive substrate 100.

In embodiments of the present disclosure, the extending direction of the first edge 101 of the light-transmissive substrate 100 is defined as a first direction C. The first direction C is parallel to the plane where the light-transmissive substrate 100 is disposed. A second direction D may be defined to be parallel to the plane where the light-transmissive substrate 100 is disposed and perpendicular to the first direction C. Referring to FIGS. 8 to 13, the light-transmissive substrate 100 includes a first edge 101, a second edge 102, a third edge 103, and a fourth edge 104, which are connected end to end in sequence. The first edge 101 is disposed opposite to the third edge 103, and the second edge 102 is disposed opposite to the fourth edge 104. The first edge 101 and the third edge 103 are both connected to the second edge 102 and the fourth edge 104. The first edge 101 and the third edge 103 both extend along the first direction C, and the second edge 102 and the fourth edge 104 both extend along the second direction D.

In an optional embodiment, the photosensitive assembly includes m vibration members 300. The m vibration members 300 are arranged on the light-transmissive substrate 100 into k vibration member groups 301. Each of the k vibration member groups 301 extends along the first direction C and includes at least one vibration member 300, wherein m and k are positive integers. In some embodiments, the light-transmissive substrate 100 includes k first areas A. Each of the k first areas A runs through the light-transmissive substrate 100 along the first direction C, and is provided with one vibration member group 301.

In embodiments of the present disclosure, a number of vibration member groups 301 may be one (i.e., k=1) or more (i.e., k>1), and a number of vibration members 300 in each vibration member group 301 may be one or more. In the case that one vibration member group 301 is provided and the one vibration member group 301 includes one vibration member 300, the vibration frequency and/or vibration amplitude of the vibration member 300 may be adjusted by adjusting the frequency and/or magnitude of the alternating voltage driving the vibration member 300, such that the vibration frequency and/or vibration amplitude of the light-transmissive substrate 100 can be adjusted. In this way, adjustment of the light convergence capability of the light-transmissive substrate 100 may be achieved. In the case that one vibration member group 301 is provided and the one vibration member group 301 includes a plurality of vibration members 300, the light convergence capability of the light-transmissive substrate 100 may be adjusted not only by adjusting the frequency and/or magnitude of the alternating voltage driving the vibration members 300, but also by adjusting the energy of the vibration loaded by the vibration member group 301 to the light-transmissive substrate 100 by adjusting the number of operating vibration members 300 in the vibration member group 301. In the case that a plurality of vibration member groups 301 are provided and each of the plurality of vibration member groups 301 includes one vibration member 300, the light convergence capability of the light-transmissive substrate 100 may be adjusted not only by adjusting the frequency and/or magnitude of the alternating voltage driving the vibration members 300, but also by adjusting the energy of the vibration loaded by the vibration member group 301 to the light-transmissive substrate 100 by adjusting the number of operating vibration member groups 301 among the plurality of vibration member groups 301. In the case that a plurality of vibration member groups 301 are provided and each of the plurality of vibration member groups 301 includes a plurality of vibration members 300, the light convergence capability of the light-transmissive substrate 100 may be adjusted not only by adjusting the frequency and/or magnitude of the alternating voltage driving the vibration members 300, but also by adjusting the energy of the vibration loaded by the vibration member group 301 to the light-transmissive substrate 100 by adjusting the number of operating vibration member groups 301 among the plurality of vibration member groups 301 and/or the number of operating vibration members 300 in each of plurality of the vibration member groups 301. That is, in the case that k is greater than 1, the light convergence capability of the light-transmissive substrate 100 may be adjusted by adjusting the frequency and/or the magnitude of the alternating voltage driving the vibration member 300, and/or the number of operating vibration members 300, and/or, the number of operating vibration member groups 301. The greater the number of operating vibration member groups 301 and the number of operating vibration members 300 are, the greater the amplitude of the light-transmissive substrate 100 is, such that the light convergence ability of the light-transmissive substrate 100 is greater.

Figure 8:
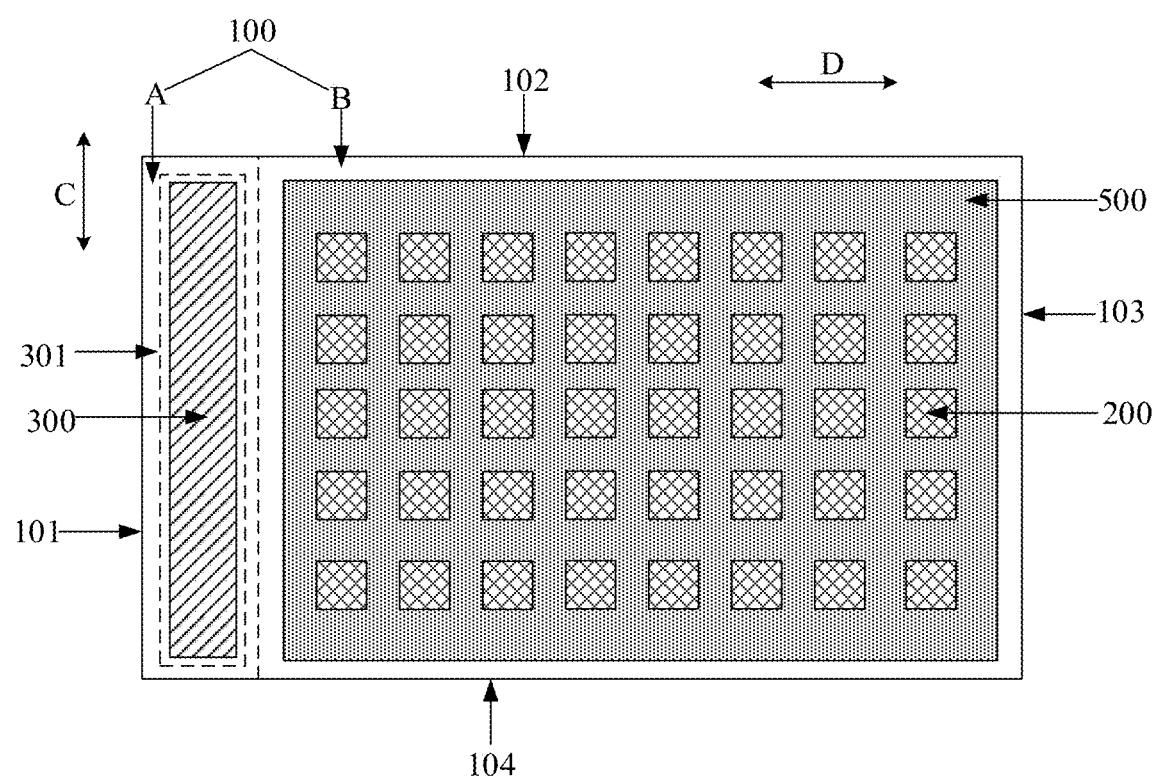
FIG. 8 is a bottom view of a photosensitive assembly according to an embodiment of the present disclosure.
Figure 9:
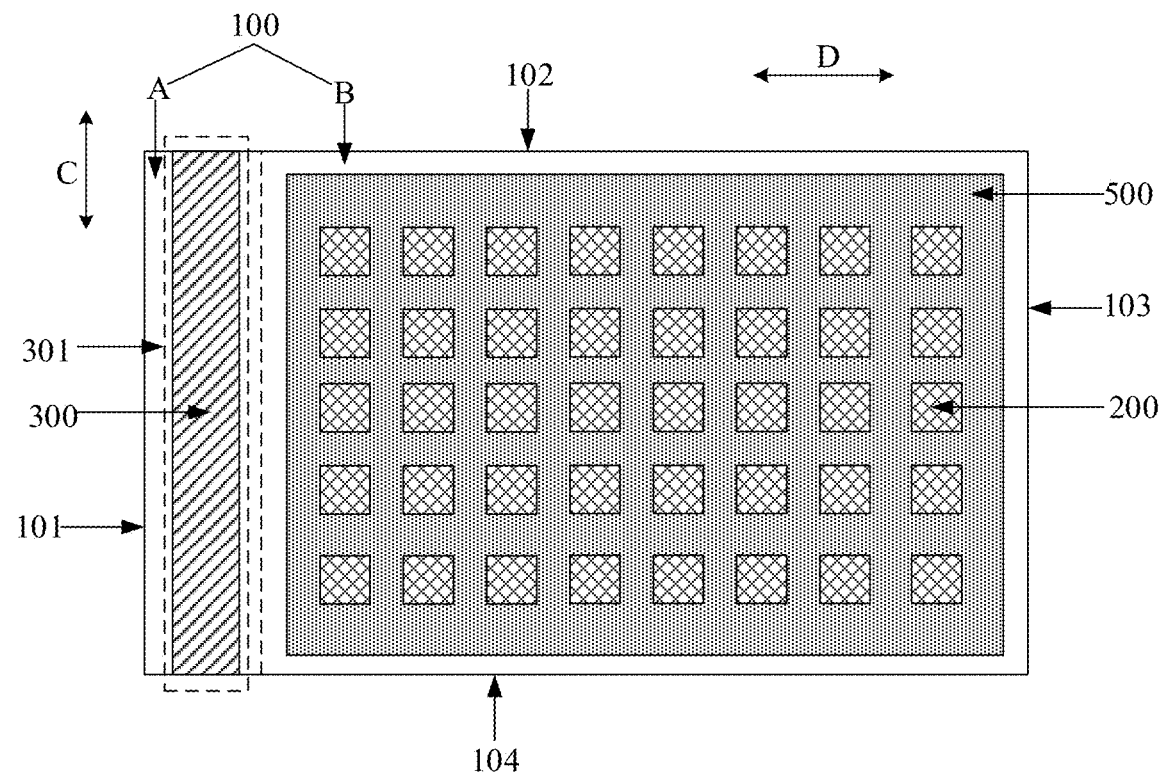
FIG. 9 is a bottom view of another photosensitive assembly according to an embodiment of the present disclosure.
Figure 10:
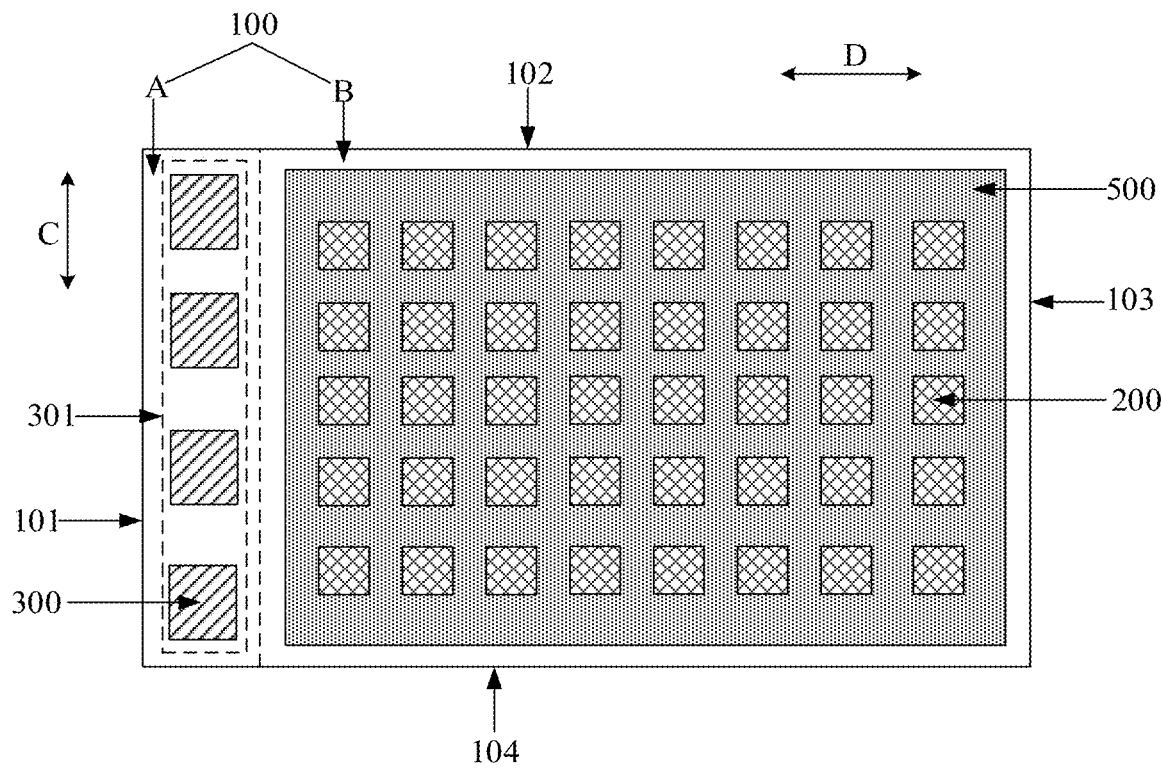
FIG. 10 is a bottom view of still another photosensitive assembly according to an embodiment of the present disclosure.

In embodiments of the present disclosure, the structure of the vibration member 300 may be configured as desired. For example, as shown in FIGS. 9 to 12, one first area A and one vibration member group 301 are provided, and the one vibration member group 301 is disposed in the one first area A. As shown in FIGS. 8 and 9, the vibration member group 301 includes one vibration member 300, and the vibration member 300 extends along the first direction C and in an elongated shape. As shown in FIGS. 10 to 12, the vibration member group 301 includes a plurality of vibration members 300, and the plurality of vibration members 300 are arranged in a straight line along the first direction C. As further shown in FIG. 13, a plurality of first areas A and a plurality of vibration member groups 301 are provided. The plurality of vibration member groups 301 are disposed in the plurality of first areas A in one to one correspondence, and each of the plurality of vibration member groups 301 includes one vibration member 300. The vibration member 300 extends the first direction C and in an elongated shape. In some embodiments, in the case that a plurality of vibration member groups 301 are provided, it is possible that some of the plurality of vibration member groups 301 may include different numbers of the vibration members 300. For example, at least one vibration member group 301 includes a plurality of vibration members 300 arranged in a straight line along the first direction C. That is, in the case that a plurality of vibration member groups 301 are provided, the plurality of vibration member groups 301 may include at least one vibration member group 301 as shown in FIGS. 9 to 12, and may further include any possible vibration member groups other than those shown in FIGS. 9 to 12. The number of vibration members 300 included in the vibration member group 301, the manner in which the vibration members 300 in the vibration member group 301 are arranged, or the structure of the vibration member 300 are not limited in the embodiments of the present disclosure.

In an optional embodiment, in the k vibration member groups 301, the vibration member 300 in at least one vibration member group 301 extends along the first direction C to the edge of the light-transmissive substrate 100: and/or, a gap exists between the edge of the light-transmissive substrate 100 and at least one of the two ends of any vibration member 300 in the first direction C, of at least one vibration member group 301. For example, as shown in FIG. 9, the vibration member group 301 includes a vibration member 300 that extends along the first direction C to the edge of the light-transmissive substrate 100, and two ends of the vibration member 300 in the first direction C are flush with a second edge 102 and a fourth edge 104 of the light-transmissive substrate 100, respectively. As further shown in FIG. 8, the vibration member group 301 includes a vibration member 300. The vibration member 300 extends along the first direction C, but does not extend to the edge of the light-transmissive substrate 100. The two ends of the vibration member 300 in the first direction C include an end approximate to the second edge 102 and the other end approximate to the fourth edge 104. A gap is defined between one of the two ends and the second edge 102 of the light-transmissive substrate 100, and a gap is defined between the other end with the fourth edge 104. For example, as further shown in FIG. 13, each of the plurality of vibration member groups 301 includes a vibration member 300. The vibration member 300 in each of the plurality of vibration member groups 301 extends along the first direction C. A gap is defined between two ends of the vibration member 300 in the first direction C, of each of the plurality of vibration member groups 301, and the edges of the light-transmissive substrate 100.

In an optional embodiment, in the k vibration member groups 301, at least one vibration member group 301 includes a plurality of vibration members 300 that are arranged along the first direction C. As a result, the plurality of vibration members 300 may operate synchronously and drive the light-transmissive substrate 100 to vibrate synchronously. In the case that one vibration member group 301 includes a plurality of vibration members 300, the vibration member 300 is not limited to an elongated shape; and the vibration member 300 may also be square, rectangular (as shown in FIG. 10), diamond, circular (as shown in FIG. 11), oval, pentagonal, hexagonal (as shown in FIG. 12), or in other shapes. The shapes of the plurality of vibration members 300 in each vibration member group 301 may be the same or different. In the case that the photosensitive assembly includes a plurality of vibration member groups 301, the numbers, shapes, dimensions, and the like of the vibration members 300 included in any two vibration member groups 301 may be the same or different. For example, the numbers, shapes, dimensions, and the like of the vibration members 300 in any two vibration member groups 301 are the same.

In embodiments of the present disclosure, in the case that the vibration frequency of the vibration member 300 is the first-order natural frequency of the light-transmissive substrate 100, the frequency of the alternating voltage driving the vibration member 300 to vibrate may be referred to as a reference frequency. In the case that the frequency of the alternating voltage driving the vibration member 300 is the reference frequency, the vibration frequency of the vibration member 300 is equal to the first-order natural frequency of the light-transmissive substrate 100, and the vibration member 300 drives the light-transmissive substrate 100 to vibrate at the first-order natural frequency of the light-transmissive substrate 100, and thereby generates resonance. In the case that the light-transmissive substrate 100 vibrates at the first-order natural frequency, half of the wavelength of the vibration wave (e.g., transverse wave) transmitted by the light-transmissive substrate 100 may be referred to as a reference dimension Dref. Referring to FIG. 5, the dimension of a portion disposed above the vibration reference surface, of the light-transmissive substrate 100 along the second direction D may be referred to as an opening dimension D. In the case that the light-transmissive substrate 100 vibrates at the first-order natural frequency, the opening dimension D is equal to the reference dimension Dref. The opening dimension D may change with changes of frequency of the alternating voltage driving the vibration member 300. In this way, the undulation degree of the light-transmissive substrate 100 is changed, achieving a zoom-like effect. The opening dimension D may be changed in the case that adjusting the frequency of the alternating voltage driving the vibration member 300, such that the vibration frequency is changed, and thereby the undulation degree of the light-transmissive substrate 100 is changed, achieving a zoom-like effect. In the case that the magnitude of the alternating voltage driving the vibration member 300 is adjusted without adjusting the frequency of the alternating voltage, the opening dimension D is not changed, and the undulation degree of the light-transmissive substrate 100 is changed. In this way, a zoom-like effect is achieved. For example, the frequency of the alternating voltage driving the vibration member 300 may be controlled to maintain the reference frequency by controlling the opening dimension to maintain the reference dimension Dref. Based on this, the protrusion degree of the light-transmissive substrate 100 may be increased or decreased by adjusting the magnitude of the alternating voltage, such that a zoom-like effect is achieved.

In all optional embodiment, the distance between the first edge 101 and the orthographic projection of the vibration member 300 most proximal to the first edge 101 of the light-transmissive substrate 100 among the m vibration members 300, on the light-transmissive substrate 100 is not less than half of the reference dimension. For example, the distance between the first edge 101 and an orthographic projection of the center of the vibration member most proximal to the first edge 101 on the light-transmissive substrate 100 is not less than half of the reference dimension. As a result, the vibration generated by the vibration member 300 can be effectively and stably transmitted to the light-transmissive substrate 100. In an exemplary embodiment, photosensitive assemblies shown in FIG. 8 and FIG. 9 both include a vibration member 300, and the distance between the first edge 101 and the orthographic projection of the vibration member 300 on the light-transmissive substrate 100 is not less than half of the reference dimension. In another exemplary embodiment, photosensitive assemblies shown in FIGS. 10 to 12 may all include a vibration member group 301. Distances between orthographic projections of all the vibration members 300 in the vibration member group 301 on the light-transmissive substrate 100 and the first edge 101 may be equal. The distance between the first edge 101 and the orthographic projection of each of the plurality of vibration members 300 on the light-transmissive substrate 100 is not less than half of the reference dimension. In still another exemplary embodiment, the photosensitive assembly shown in FIG. 13 includes a plurality of vibration member groups 301, and each of the plurality of vibration member groups 301 includes one vibration member 300. The distance between the first edge 101 and an orthographic projection of the leftmost vibration member 300 most proximal to the first edge 101, on the light-transmissive substrate 100 is not less than half of the reference dimension.

In an optional embodiment, a plurality of vibration member groups 301 are provided. The plurality of vibration member groups 301 are arranged along the second direction I), and a first axis of each of the plurality of vibration member groups 301 is parallel to the first direction C. The distance between the first axes of any two adjacent vibration member groups 301 among the plurality of vibration member groups 301 ranges from (n+0.8)*Dref to (n+1.2)*Dref. Based on this, the plurality of vibration member groups 301 may cooperate with each other to jointly drive the light-transmissive substrate 100 to vibrate, such that the vibration amplitude of the light-transmissive substrate 100 is greater and the light convergence capability of the light-transmissive substrate 100 is stronger. For example, the distance between the first axes of any two adjacent vibration member groups 301 among the plurality of vibration member groups 301 is (n+1)*Dref, such that the cooperation between the plurality of vibration member groups 301 is more efficient. The n herein is a natural number, and depending on different values of n, the plurality of vibration member groups 301 may be arranged at equal or non-equal intervals in the second direction D. In an exemplary embodiment, the photosensitive assembly includes five vibration member groups that are arranged sequentially in the second direction D. The distance between the first axis of the second vibration member group 301 and the first axis of the third vibration member group 301 may be Dref. The distance between the first axis of the third vibration member group 301 and the first axis of the fourth vibration member group 301 may be three times Dref. The distance between the first axis of the fourth vibration member group 301 and the first axis of the fifth vibration member group 301 may be twice Dref. Consequently, the five vibration member groups 301 are arranged at non-equal intervals in the second direction D. In another exemplary embodiment, the distances between the first axes of any two adjacent vibration member groups 301 among the plurality of vibration member groups 301 are all the equal, and are (n+1)*Dref. Consequently, the plurality of vibration member groups 301 are arranged at equal intervals in the second direction D.

In an optional embodiment, the distance between the first edge 101 and the first axis of any one vibration member group 301 ranges from (n+0.3)*Dref to (n+0.7)*Dref. As a result, in the case that a plurality of vibration member groups 301 are provided, the plurality of vibration member groups 301 may cooperate with each other to jointly drive the light-transmissive substrate 100 to vibrate, such that the vibration amplitude of the light-transmissive substrate 100 is greater and the light convergence capability of the light-transmissive substrate 100 is stronger. The values of n may be different for different vibration member groups. In an exemplary embodiment, the distance between the first edge 101 and the first axis of any one vibration member group 301 is (n+0.5)*Dref.

In some embodiments, the dimension of the vibration member 300 in the second direction D is not greater than the reference dimension Dref, and the dimension of the vibration member 300 in the second direction D ranges from 1 mm to 10 mm, facilitating the vibration member 300 to load sufficient intensity of vibration to the light-transmissive substrate 100, and preventing the dimension of the vibration member 300 in the second direction D from becoming too large. In an exemplary embodiment, the dimension of the vibration member 300 in the second direction D ranges from 1 mm to 5 mm.

In embodiments of the present disclosure, the thickness of the vibration member 300 is not greater than 10 µm, such that the thickness of the photosensitive assembly is reduced, facilitating the sliminess of the photosensitive assembly. In some embodiments, the thickness of the vibration member 300 ranges from 0.1 µm to 10 µm, and may for example be turn to 2 µm. The thickness of the vibration member 300 refers to the dimension of the vibration member 300 in a direction perpendicular to the plate surface of the light-transmissive substrate 100. The thickness of the vibration member 300 is a superimposed thickness of the first electrode 310, the piezoelectric layer 320 and the second electrode 330, that is, a sum of the thicknesses of the first electrode 310, the piezoelectric layer 320 and the second electrode 330.

Figure 14:
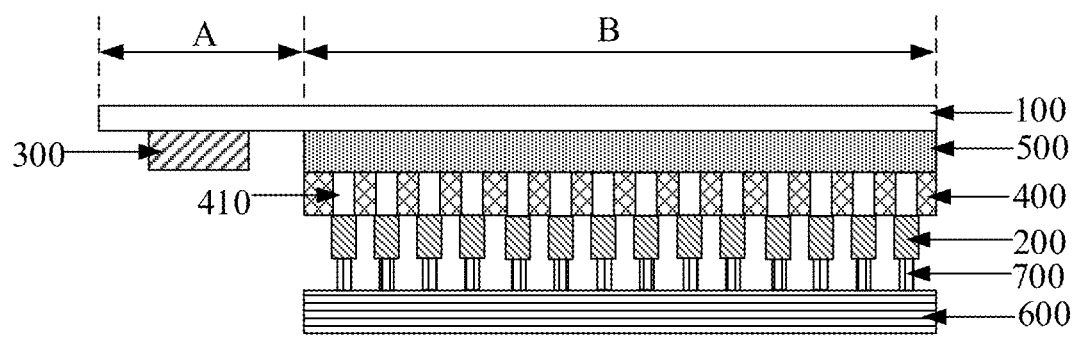
FIG. 14 is a schematic structural diagram of still another photosensitive assembly according to an embodiment of the present disclosure.
Figure 15:
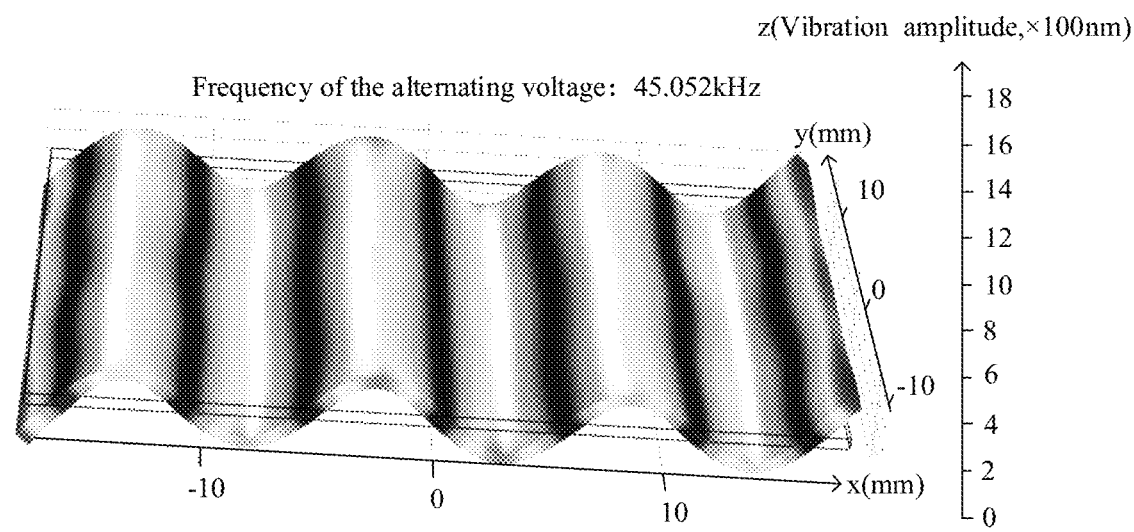
FIG. 15 is a topography diagram of a light-transmissive substrate being driven to vibrate by a vibration member according to an embodiment of the present disclosure.
Figure 16:
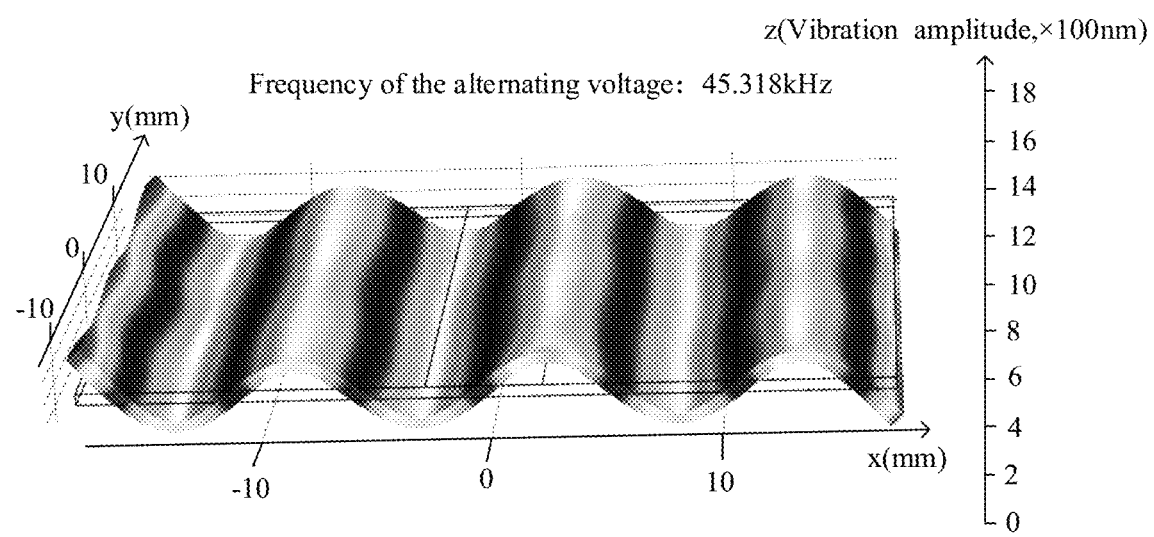
FIG. 16 is a topography diagram of a light-transmissive substrate being driven to vibrate by another vibration member according to an embodiment of the present disclosure.
Figure 17:
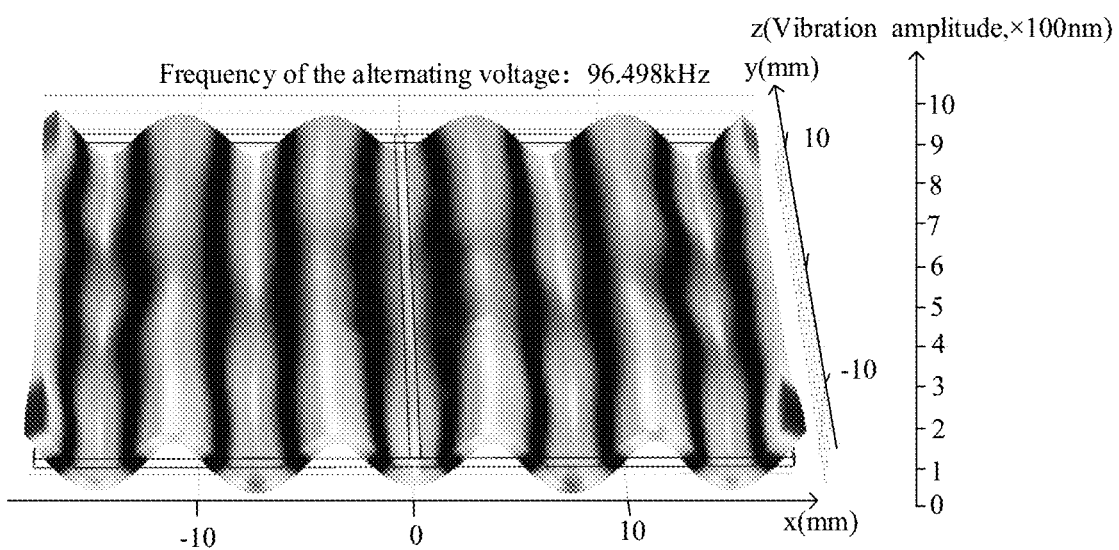
FIG. 17 is a topography diagram of a light-transmissive substrate being driven to vibrate by still another vibration member according to an embodiment of the present disclosure.
Figure 18:
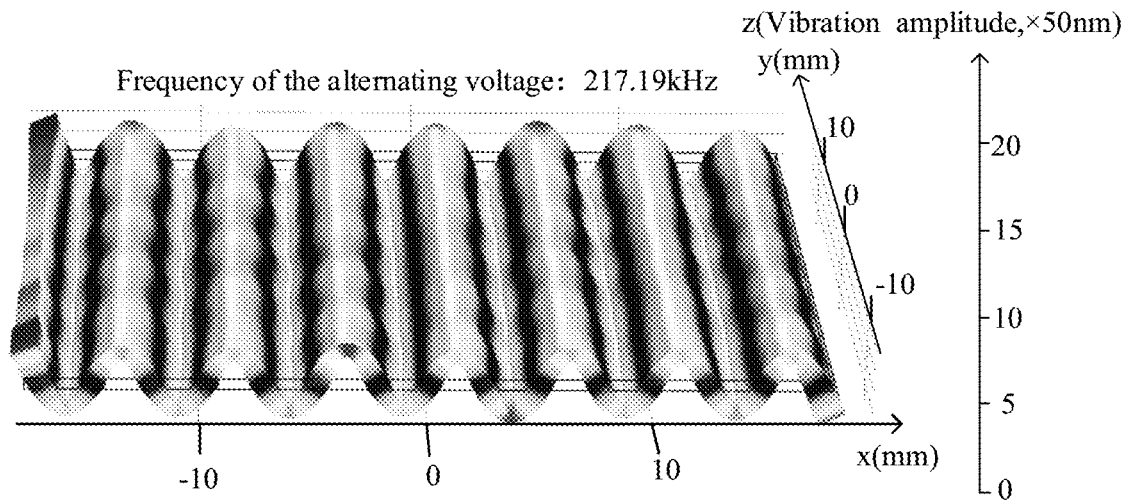
FIG. 18 is a topography diagram of a light-transmissive substrate being driven to vibrate by yet another vibration member according to an embodiment of the present disclosure.

In some embodiments, FIG. 14 is a schematic structural diagram of another photosensitive assembly according to embodiments of the present disclosure. The photosensitive assembly may further include a photosensitive driving circuit 600 connected to each of the light sensors 200, and the photosensitive driving circuit 600 is configured to receive a detection signal generated by each of the light sensors 200 in response to an external light signal. As shown in FIG. 14, the photosensitive driving circuit 600 is disposed on and connected to a side distal from the light-transmissive substrate 100, of the light sensor 200. For example, the photosensitive driving circuit 600 may be connected to a side distal from the light-transmissive substrate 100, of each of the light sensors 200 respectively by a conductive structure 700 such as solder.

The light sensor 200 may be an infrared light sensor, a visible light sensor, an ultraviolet light sensor, or other light sensors as long as it is capable of detecting light. In the case that the photosensitive assembly includes a plurality of light sensors 200, the plurality of light sensors 200 may be a same type of light sensor 200, or may be different types of light sensors 200. For example, the plurality of light sensors 200 may all be infrared light sensors, or a part of the plurality of light sensors 200 may be infrared light sensors and another part of the light sensors 200 may be visible light sensors, which are not limited in embodiments of the present disclosure.

In an embodiment of the present disclosure, a plurality of light sensors 200 are distributed in arrays. The plurality of light sensors 200 may all be infrared light sensors for detecting infrared light. The detection signal provided by the light sensors 200 distributed in arrays may be configured to generate a detection image. The detection image may serve as a display image displayed by the electronic device, or may be displayed in response to being corrected/rendered/modified by the electronic device, or may serve as basis information for feature recognition by the electronic device, or may be stored or processed as data information. For example, the light sensors 200 distributed in arrays may be a portion of a camera assembly, and the detection signal provided by the the light sensors 200 may be configured to generate photographs. For another example, the light sensors 200 distributed in arrays may be a portion of an infrared fingerprint recognizing chip, and the detection signal provided by the the light sensors 200 may generate a fingerprint image for feature recognition to perform the fingerprint recognition or matching, In an optional embodiment, referring to FIG. 2, FIG. 6, FIG. 7 and FIG. 14, the photosensitive assembly further includes a collimator 400 disposed between the light sensor 200 and the light-transmissive substrate 100. The collimator 400 is configured to shield interfering light, such that the light sensor 200 can only receives light at a specific incident angle, thereby improving the accuracy of the light detecting result. The area of the collimator 400 corresponding to the light sensor 200 is light-transmissive, such that light may be transmitted to the light sensor 200 through the collimator 400.

In an exemplary embodiment, the collimator 400 includes a light-shielding portion and a light-transmissive portion disposed in the light-shielding portion. The light-transmissive portion may be a light-transmissive aperture 410 penetrating through the light-shielding portion in a direction perpendicular to the plate surface of the light-transmissive substrate 100. Alternatively, the light-transmissive portion may be a transparent filling portion penetrating through the light-shielding portion in a direction perpendicular to the plane where the light-transmissive substrate 100 is disposed. Each light-transmissive portion of the collimator 400 corresponds to the light sensor 200 one by one, and the orthographic projection of each of the light sensors 200 on the light-transmissive substrate 100 is at least partially overlapped with the orthographic projection of the corresponding light-transmissive portion on the light-transmissive substrate 100. In an embodiment, the collimator 400 includes a light-shielding substrate. The light-shielding substrate The orthographic projection of the light sensor 200 on the light-shielding substrate is at least partially overlapped with the corresponding light-transmissive aperture. In this embodiment, the light-shielding substrate may serve as a light-shielding portion of the collimator 400, such that the light radiated to the light sensor 200 at a large angle can be filtered out.

In some embodiments, the photosensitive assembly further includes an optical adhesive layer 500 disposed between the collimator 400 and the light-transmissive substrate 100. The collimator 400 is connected to the light-transmissive substrate 100 via the optical adhesive layer 500. That is, the collimator 400 is bonded to the light-transmissive substrate 100 via the optical adhesive layer 500. A refractive index of the optical adhesive layer 500 may be equal to a refractive index of the light-transmissive substrate 100. In this way, during the vibration of the light-transmissive substrate 100, although the contact surface between the optical adhesive layer 500 and the light-transmissive substrate 100 is deformed, the deformation of the contact surface may cause no change to the optical path since the refractive index of the light-transmissive substrate is equal to the refractive index of the optical adhesive layer 500. The optical adhesive layer 500 may have a similar rather than an absolutely same refractive index with the light-transmissive substrate 100. For example, the difference between the optical adhesive layer 500 and the light-transmissive substrate 100 in the refractive index may fall within 0.5.

As mentioned above, the vibration frequency may be adjusted by adjusting the opening dimension D by adjusting the frequency of the alternating voltage driving the vibration member 300, such that the undulation degree of the light-transmissive substrate 100 is changed, achieving a zoom-like. It is also possible to adjust the vibration amplitude of the light-transmissive substrate 100 by adjusting the magnitude of the alternating voltage driving the vibration member 300, such that the undulation degree of the light-transmissive substrate 100 is changed, achieving a zoom-like effect. For ease of understanding, embodiments of the present disclosure also conduct an experiment. The photosensitive assembly employed in the experiment includes a vibration member 300 extending along the first direction C and penetrating through the light-transmissive substrate 100. For example, the photosensitive assembly employed in the experiments is the photosensitive assembly as shown in FIG. 2. During the experiments, the vibration member 300 is driven to vibrate by alternating voltages at frequencies of 45.052 kHz, 45.318 kHz, 96.498 kHz, 217.19 kHz, and 285.4 kHz, respectively, such that the vibration member 300 drives the light-transmissive substrate 100 to vibrate. Then, vibration topographys of the light-transmissive substrate 100 at each of the alternating voltages are recorded.

Figure 19:
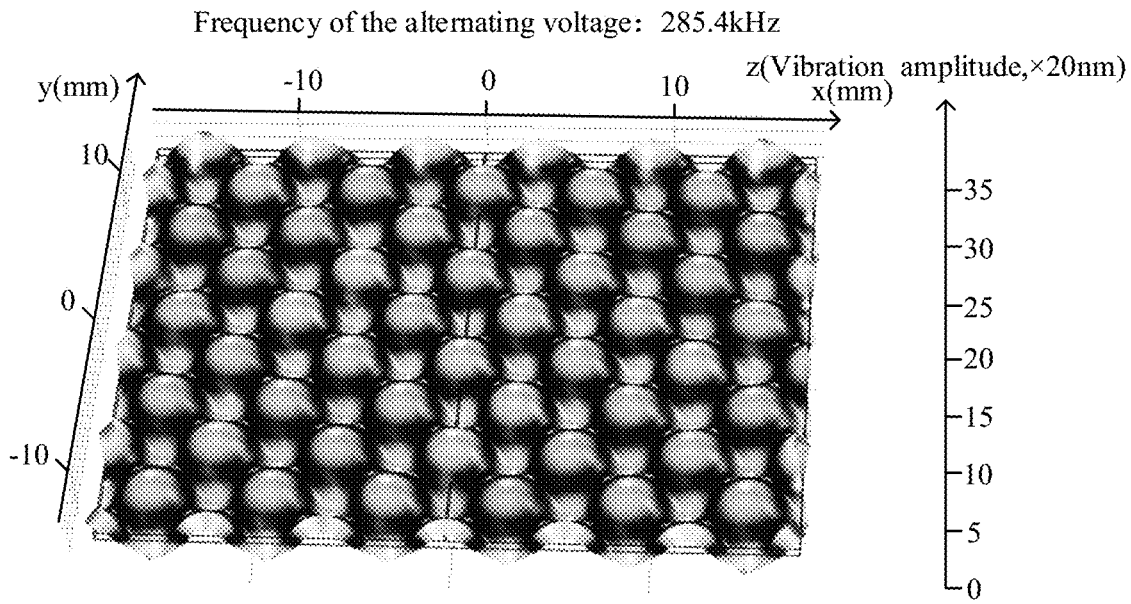
FIG. 19 is a topography diagram of a light-transmissive substrate being driven to vibrate by yet another vibration member according to an embodiment of the present disclosure.

In an exemplary embodiment, FIGS. 15 to 19 sequentially show the vibration topography of the light-transmissive substrate 100 in the case that the vibration member 300 is driven to vibrate by alternating voltages at frequencies of 45.052 kHz, 45.318 kHz, 96.498 kHz, 217.19 kHz, and 285.4 kHz, respectively. FIGS. 15 to 19 show topographys of the light-transmissive substrate 100 at a certain instant. Based on the topography s of the light-transmissive substrate 100 shown in FIGS. 15 to 19, it may be determined that in the case that the frequency of the alternating voltage is changed, the opening dimension D is changed, and thereby the vibration frequency of the light-transmissive substrate 100 is changed. For example, in the case that the frequency of the alternating voltage is increased, the opening dimension D of the light-transmissive substrate 100 is decreased, and the vibration frequency of the light-transmissive substrate 100 is increased; and in the case that the frequency of the alternating voltage is decreased, the opening dimension D of the light-transmissive substrate 100 is increased, and the vibration frequency of the light-transmissive substrate 100 is decreased. The transmission of vibration waves (e.g., transverse waves is the cause of the deformation of the light-transmissive substrate 100, and periods of the vibration waves are related to vibration frequency. In the case that the vibration frequency of the vibration wave is increased, the period of the vibration wave is decreased, such that the opening dimension D of the light-transmissive substrate 100 is decreased. In the case that the vibration frequency of the vibration wave is decreased, the period of the vibration wave is increased, such that the opening dimension D of the light-transmissive substrate 100 is increased. Based on the topographys of the light-transmissive substrate 100 shown in FIGS. 15 to 19, it may also be determined that the light-transmissive substrate 100 is provided with a regular and uniform topography in most areas, especially in the areas beyond the edges of the light-transmissive substrate 100. Therefore, in the present disclosure, a gap may be defined between each of the light sensors 200 and the edge of the light-transmissive substrate 100, so as to ensure that each of the light sensors 200 is disposed in a uniform environment. In addition, different frequencies of the alternating voltage may cause the light-transmissive substrate 100 to generate different undulation topographies. For example, protrusions in a linear stripe shape may be formed side by side on the light-transmissive substrate 100 as shown in FIGS. 15 to 18, and the light-transmissive substrate 100 may have a topography similar to a cylindrical lens array. Spherical protrusions distributed in arrays may be formed on the light-transmissive substrate 100 as shown in FIG. 19, and the light-transmissive substrate 100 may have a topography similar to a spherical lens array.

Described above is an introduction of the photosensitive assembly according to the embodiments of the present disclosure. Based on a same inventive concept, the embodiments of the present disclosure further provide an electronic device including any of the photosensitive assembly according to the aforesaid embodiments. Therefore, the electronic device has the beneficial effect of the corresponding photosensitive assembly, which is not be repeated here.

In some embodiments, the electronic device is a fingerprint recognition chip, an infrared touch panel, an infrared camera, or other electronic modules. Alternatively, the electronic device is a smartphone, a tablet, a smartwatch, a moving picture experts group audio layer IV (MP4) player, a laptop, a virtual reality device, or other terminal products.

Figure 20:
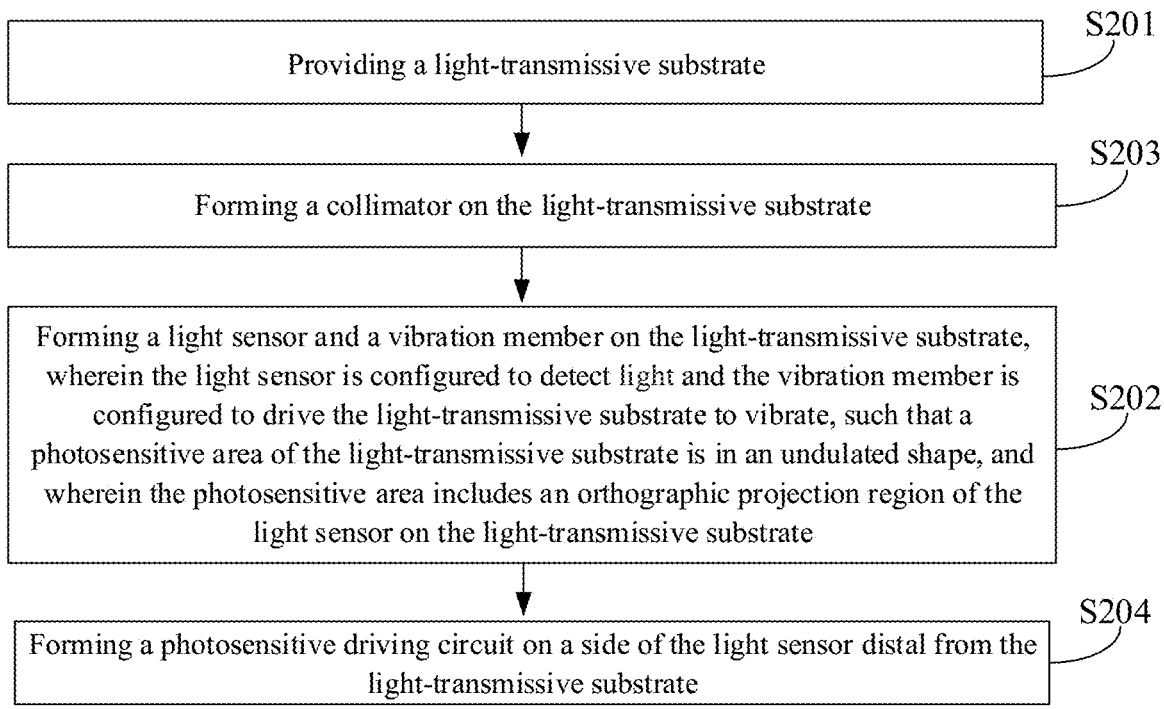
FIG. 20 is a flowchart of a method for manufacturing a photosensitive assembly according to an embodiment of the present disclosure.

Described above is an introduction of the photosensitive assembly and electronic device according to the present disclosure, and the method for manufacturing the photosensitive assembly will be described below. The method and principle for manufacturing the photosensitive assembly are described in the following embodiments, FIG. 20 is a flowchart of a method for manufacturing the photosensitive assembly according to an embodiment of the present disclosure. The method is configured to manufacturing the photosensitive assembly according to aforesaid embodiments. As shown in FIG. 20, the method includes following processes.

In S201, a light-transmissive substrate is provided.

The light-transmissive substrate is a rigid substrate. For example the light-transmissive substrate is a glass substrate with a multi-orders natural frequency.

In S202, a light sensor and a vibration member are formed on the light-transmissive substrate. The light sensor is configured to detect light, and the vibration member is configured to drive the light-transmissive substrate to vibrate, such that a photosensitive area of the light-transmissive substrate is in an undulated shape. The photosensitive area includes an orthographic projection region of the light sensor on the light-transmissive substrate.

The light sensor and the vibration member may be disposed on a same side of the light-transmissive substrate. In an optional embodiment, the vibration member is first formed on the light-transmissive substrate, and then the light sensor is formed on the light-transmissive substrate.

In an exemplary embodiment, forming the vibration member on the light-transmissive substrate includes: firstly, sequentially forming a first electrode material layer and a piezoelectric material layer on a first plate surface of the light-transmissive substrate, and performing a polarization on the piezoelectric material layer; then, forming a second electrode material layer on a side of the piezoelectric material layer distal from the light-transmissive substrate; and finally, performing a patterning on the second electrode material layer, the piezoelectric material layer and the first electrode material layer, so as to acquire a first electrode, a piezoelectric layer and a second electrode laminated sequentially in a direction distal from the light-transmissive substrate, thereby acquiring the vibration member.

The process for forming any of the first electrode material layer, the piezoelectric material layer and the second electrode material layer may be a plasma enhanced chemical vapor deposition (PECVD) process, a film dumping process, a coating process, or the like. The second electrode material layer, the piezoelectric material layer and the first electrode material layer may be patterned by the one-time patterning process, or may be patterned by the three-time patterning process respectively, which is not limited in the embodiments of the present disclosure. The one-time patterning process may include steps such as photoresist coating, exposure, development, etching and photoresist. In an exemplary embodiment, the second electrode is acquired by performing a treatment on the second electrode material layer by the one-time patterning process, and then the piezoelectric layer is acquired by sequentially etching the piezoelectric material layer and the first electrode material layer based on taking the second electrode as a mask. In addition, the second electrode is laminated on a side of the piezoelectric layer distal from the light-transmissive substrate, In an exemplary embodiment, forming a light-shielding member on the light-transmissive substrate includes bonding the light sensor to the first plate surface of the light-transmissive substrate via an optical adhesive, or manufacturing the light sensor on the first plate surface of the light-transmissive substrate.

In some embodiments, as shown in FIG. 20, the method further includes following process S203, S203 may be performed prior to forming the light sensor on the light-transmissive substrate. For example, S203 is performed prior to S202.

In S203, a collimator is formed on the light-transmissive substrate.

In an exemplary embodiment, the collimator is bonded to the first plate surface of the light-transmissive substrate via an optical adhesive layer, In some embodiments, forming the light sensor on the light-transmissive substrate includes forming the light sensor on a side of the collimator distal from the light-transmissive substrate. The area in the collimator corresponding to the light sensor is light-transmissive.

In some embodiments, as shown in FIG. 20, the method further includes following process S204.

In S204, a photosensitive driving circuit is formed on a side of the light sensor distal from the light-transmissive substrate.

In some embodiments, the photosensitive driving circuit is formed on a side of the light sensor distal from the light-transmissive substrate by a conductive structure such as solder, and each of light sensors is connected to the photosensitive driving circuit by at least one conductive structure. For example, the photosensitive driving circuit is soldered to a side of the light sensor distal from the light-transmissive substrate by solder.

In summary, according to the photosensitive assembly manufactured by the method provided by the embodiments of the present disclosure, the photosensitive area of the light-transmissive substrate may be in an undulated shape by driving the light-transmissive substrate to vibrate via the vibration member. The photosensitive area in the undulated shape, of the light-transmissive substrate, can converge the light radiated to the photosensitive area to the light sensor, thereby allowing the light sensor to perform a light detection. Furthermore, a zoom function can be realized by controlling changes in the undulation degree of the photosensitive area of the light-transmissive substrate, such that the photosensitive assembly can detect the target object in different ranges. In addition, the photosensitive assembly uses the light-transmissive substrate for focusing without a need for a microlens. In this way, the thickness and volume of the photosensitive assembly can be reduced, facilitating the slimness of the electronic device based on the photosensitive assembly.

The sequence of processes of the method for manufacturing the photosensitive assembly according to embodiments of the present disclosure may be appropriately adjusted, and the processes may also be correspondingly added or deleted according to situations. Any method that can be easily conceived by any one skilled in the art within the technical scope disclosed in the present disclosure shall be contained within the protection scope of the present disclosure.

Other embodiments of the present disclosure are obvious to those skilled in the art based on consideration of the specification and practice of the present disclosure. The present disclosure is intended to cover any variations, uses, or adaptations of the present disclosure. These variations, uses, or adaptations follow the general principles of the present disclosure, and include common knowledge or commonly used technical means, which are not disclosed herein. The specification and the embodiments are to be considered as exemplary only, and the true scope and spirit of the present disclosure are indicated by the appended claims.

What is claimed is:

1. A photosensitive assembly, comprising:
   a light-transmissive substrate;
   a light sensor, disposed on a side of the light-transmissive substrate; and a vibration member, configured to drive the light-transmissive substrate to vibrate, such that a photosensitive area of the light-transmissive substrate is in an undulated shape, wherein the photosensitive area comprises an orthographic projection region of the light sensor on the light-transmissive substrate.

2. The photosensitive assembly according to claim 1, wherein
the light-transmissive substrate is a glass substrate.

3. The photosensitive assembly according to claim 1, wherein
a thickness of the light-transmissive substrate ranges from 0.01 mm to 10 mm.

4. The photosensitive assembly according to claim 1, comprising:
m vibration members, wherein the m vibration members are arranged into k vibration member groups on the light-transmissive substrate, the vibration member group extends along a first direction and comprises at least one vibration member, and both m and k are positive integers.

5. The photosensitive assembly according to claim 4, wherein
a vibration member of at least one of the vibration member groups extends along the first direction to an edge of the light-transmissive substrate.

6. The photosensitive assembly according to claim 4, wherein
for two ends of any one vibration member of at least one of the vibration member groups in the first direction, a gap is defined between at least one of the two ends and an edge of the light-transmissive substrate.

7. The photosensitive assembly according to claim 4, wherein
at least one of the vibration member groups comprises a plurality of vibration members, wherein the plurality of vibration members are arranged along the first direction.

8. The photosensitive assembly according to claim 4, wherein
the light-transmissive substrate is provided with a first edge extending along the first direction;
wherein a distance between the first edge and an orthographic projection of the vibration member most proximal to the first edge among the m vibration members on the light-transmissive substrate is not less than half of a reference dimension, wherein the reference dimension is half of a wavelength of a vibration wave transmitted by the light-transmissive substrate in response to vibration at a first-order natural frequency.

9. The photosensitive assembly according to claim 8, wherein
k is greater than 1, and the k vibration member groups are arranged along a second direction, wherein the second direction is parallel to a plane where the light-transmissive substrate is disposed and perpendicular to the first direction; and
a distance between first axes of any two adjacent vibration member groups among the k vibration member groups ranges from (n+0.8)*Dref to (n+1.2)*Dref, wherein the first axis is parallel to the first direction, n represents a natural number, and Dref represents the reference dimension.

10. The photosensitive assembly according to claim 4, wherein
the light-transmissive substrate is provided with a first edge extending along the first direction;

wherein a distance between a first axis of any one of the vibration member groups and the first edge ranges from (n+0.3)*Dref to (n+0.7)*Dref, wherein the first axis is parallel to the first direction, n represents a natural number, and Dref represents a reference dimension, the reference dimension being half of a wavelength of a vibration wave transmitted by the light-transmissive substrate in response to vibration at a first-order natural frequency.

11. The photosensitive assembly according to claim 4, wherein
a dimension of the vibration member in a second direction ranges from 1 mm to 10 mm, wherein the second direction is parallel to a plane where the light-transmissive substrate is disposed and perpendicular to the first direction.

12. The photosensitive assembly according to claim 4, wherein
a dimension of the vibration member in the second direction is not greater than a reference dimension, wherein the reference dimension is half of a wavelength of a vibration wave transmitted by the light-transmissive substrate in response to vibration at a first-order natural frequency, and the second direction is parallel to a plane where the light-transmissive substrate is disposed and perpendicular to the first direction.

13. The photosensitive assembly according to claim 1, wherein
an orthographic projection of the vibration member on the light-transmissive substrate is not overlapped with an orthographic projection of the light sensor on the light-transmissive substrate.

14. The photosensitive assembly according to claim 1, wherein
an orthographic projection of the vibration member on the light-transmissive substrate is at least partially overlapped with an orthographic projection of the light sensor on the light-transmissive substrate, and a light transmittance of the vibration member is not less than 10%.

15. The photosensitive assembly according to claim 1, wherein
a thickness of the vibration member ranges from 0.1 um to 10 um.

16. The photosensitive assembly according to claim 1, comprising:
a collimator, disposed between the light sensor and the light-transmissive substrate.

17. The photosensitive assembly according to claim 15, wherein
an area of the collimator corresponding to the light sensor is light-transmissive.

18. A method for manufacturing a photosensitive assembly, comprising:
providing a light-transmissive substrate; and
forming a light sensor and a vibration member on the light-transmissive substrate;
wherein the vibration member is configured to drive the light-transmissive substrate to vibrate, such that a photosensitive area of the light-transmissive substrate is in an undulated shape, and the photosensitive area comprises an orthographic projection region of the light sensor on the light-transmissive substrate.

19. The method according to claim 18, further comprising:
forming a collimator on the light-transmissive substrate;

wherein forming the light sensor on the light-transmissive substrate comprises forming the light sensor on a side, distal from the light-transmissive substrate, of the collimator, and an area of the collimator corresponding to the light sensor is light-transmissive.

20. An electronic device, comprising a photosensitive assembly;
wherein the photosensitive assembly comprises:
a light-transmissive substrate;
a light sensor, disposed on a side of the light-transmissive substrate; and
a vibration member, configured to drive the light-transmissive substrate to vibrate, such that a photosensitive area of the light-transmissive substrate is in an undulated shape, wherein the photosensitive area comprises an orthographic projection region of the light sensor on the light-transmissive substrate.

* * * * *